United States Patent
Li et al.

(10) Patent No.: US 11,901,209 B2
(45) Date of Patent: *Feb. 13, 2024

(54) HIGH TEMPERATURE BIPOLAR ELECTROSTATIC CHUCK

(71) Applicant: Applied Materials, Inc., Santa Clara, CA (US)

(72) Inventors: Jian Li, Fremont, CA (US); Zheng J. Ye, Santa Clara, CA (US); Dmitry A. Dzilno, Sunnyvale, CA (US); Juan Carlos Rocha-Alvarez, San Carlos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/172,217

(22) Filed: Feb. 21, 2023

(65) Prior Publication Data

US 2023/0207371 A1 Jun. 29, 2023

Related U.S. Application Data

(63) Continuation of application No. 17/076,649, filed on Oct. 21, 2020, now Pat. No. 11,587,817.

(51) Int. Cl.
*H01T 23/00* (2006.01)
*H01L 21/683* (2006.01)
(Continued)

(52) U.S. Cl.
CPC .... *H01L 21/6833* (2013.01); *H01J 37/32724* (2013.01); *H01L 21/67103* (2013.01); *H01J 2237/2007* (2013.01); *H01J 2237/332* (2013.01)

(58) Field of Classification Search
None
See application file for complete search history.

(56) References Cited

U.S. PATENT DOCUMENTS

| 5,867,359 A | 2/1999 | Sherman |
| 5,908,334 A | 6/1999 | Chen et al. |

(Continued)

FOREIGN PATENT DOCUMENTS

| JP | 1187478 A | 3/1999 |
| JP | 2006203122 A | 8/2006 |

(Continued)

OTHER PUBLICATIONS

Application No. PCT/US2021/054082, International Search Report and Written Opinion, dated Jan. 26, 2022, 10 pages.

*Primary Examiner* — Stephen W Jackson
(74) *Attorney, Agent, or Firm* — Kilpatrick Townsend & Stockton LLP

(57) ABSTRACT

Exemplary support assemblies may include an electrostatic chuck body defining a substrate support surface. The substrate support assemblies may include a support stem coupled with the electrostatic chuck body. The substrate support assemblies may include a heater embedded within the electrostatic chuck body. The substrate support assemblies may include a first bipolar electrode embedded within the electrostatic chuck body between the heater and the substrate support surface. The first bipolar electrode may include at least two separated mesh sections, with each mesh section characterized by a circular sector shape. The substrate support assemblies may include a second bipolar electrode embedded within the electrostatic chuck body between the heater and the substrate support surface. The second bipolar electrode may include a continuous mesh extending through the at least two separated mesh sections of the first bipolar electrode.

12 Claims, 6 Drawing Sheets

(51) Int. Cl.
*H01L 21/67* (2006.01)
*H01J 37/32* (2006.01)

(56) References Cited

U.S. PATENT DOCUMENTS

| | | | |
|---|---|---|---|
| 5,968,273 | A | 10/1999 | Kadomura et al. |
| 11,587,817 | B2 * | 2/2023 | Li ...................... H01L 21/6833 |
| 2012/0227886 | A1 | 9/2012 | Hsiao et al. |
| 2020/0303230 | A1 | 9/2020 | Sonoda |
| 2020/0402777 | A1 * | 12/2020 | Sasaki ............... H01J 37/32697 |

FOREIGN PATENT DOCUMENTS

| | | |
|---|---|---|
| KR | 101415551 B1 | 7/2014 |
| TW | 201901800 A | 1/2019 |
| WO | 2019169102 A1 | 9/2019 |
| WO | 2022086724 A1 | 4/2022 |

\* cited by examiner

HIGH TEMPERATURE BIPOLAR ELECTROSTATIC CHUCK

CROSS-REFERENCES TO RELATED APPLICATIONS

This patent application is a continuation of U.S. application Ser. No. 17/076,649 filed on Oct. 21, 2020, which is incorporated herein by reference.

TECHNICAL FIELD

The present technology relates to components and apparatuses for semiconductor manufacturing. More specifically, the present technology relates to substrate support assemblies and other semiconductor processing equipment.

BACKGROUND

Integrated circuits are made possible by processes which produce intricately patterned material layers on substrate surfaces. Producing patterned material on a substrate requires controlled methods for forming and removing material. The temperature at which these processes occur may directly impact the final product. Substrate temperatures are often controlled and maintained with the assembly supporting the substrate during processing. Internally located heating devices may generate heat within the support, and the heat may be transferred conductively to the substrate. The substrate support may also be utilized in some technologies to develop a substrate-level plasma, as well as to chuck the substrate to the support electrostatically. Plasma generated near the substrate may cause bombardment of components, as well as parasitic plasma formation in unfavorable regions of the chamber. The conditions may also lead to discharge between substrate support electrodes. Additionally, utilizing the pedestal for both heat generation and plasma generation may cause interference effects.

As a variety of operational processes may utilize increased temperature as well as substrate-level plasma formation, constituent materials of the substrate support may be exposed to temperatures that affect the electrical operations of the assembly. Thus, there is a need for improved systems and methods that can be used to produce high quality devices and structures. These and other needs are addressed by the present technology.

SUMMARY

Exemplary support assemblies may include an electrostatic chuck body defining a substrate support surface. The substrate support assemblies may include a support stem coupled with the electrostatic chuck body. The substrate support assemblies may include a heater embedded within the electrostatic chuck body. The substrate support assemblies may include a first bipolar electrode embedded within the electrostatic chuck body between the heater and the substrate support surface. The first bipolar electrode may include at least two separated mesh sections, with each mesh section characterized by a circular sector shape. The substrate support assemblies may include a second bipolar electrode embedded within the electrostatic chuck body between the heater and the substrate support surface. The second bipolar electrode may include a continuous mesh extending through the at least two separated mesh sections of the first bipolar electrode In some embodiments, the second bipolar electrode may be or include two mesh sections coupled by a bridge between the at least two separated mesh sections of the first bipolar electrode. The two mesh sections of the second bipolar electrode may be characterized by a circular sector shape. The assemblies may include an RF power supply or variable capacitor coupled with both of the first bipolar electrode and the second bipolar electrode. The at least two separated mesh sections of the first bipolar electrode may include four mesh sections separated from one another with gaps. The second bipolar electrode may include an annular mesh extending about the four mesh sections of the first bipolar electrode. The annular mesh may include bridges extending through the gaps between the separated mesh sections of the first bipolar electrode. The assemblies may include a first RF power supply or variable capacitor coupled with the first bipolar electrode. The assemblies may include a second RF power supply or variable capacitor coupled with the second bipolar electrode. The assemblies may include a first DC power supply coupled with the first bipolar electrode. The assemblies may include a second DC power supply coupled with the second bipolar electrode. The assemblies may include a third electrode positioned radially outward from and extending about the first bipolar electrode and the second bipolar electrode. The assemblies may include a third RF power supply or variable capacitor coupled with the third electrode. A plurality of lead lines may extend within the electrostatic chuck body to couple the third electrode with the third RF power supply or variable capacitor. The electrostatic chuck body may be or include a ceramic material. The ceramic material may be or include aluminum nitride.

Some embodiments of the present technology may encompass substrate support assemblies. The assemblies may include an electrostatic chuck body defining a substrate support surface. The assemblies may include a support stem coupled with the electrostatic chuck body. The assemblies may include a first bipolar electrode embedded within the electrostatic chuck body beneath the substrate support surface. The first bipolar electrode may include at least two mesh sections separated by a gap. The assemblies may include a second bipolar electrode embedded within the electrostatic chuck body beneath the substrate support surface. The second bipolar electrode may extend through the gap between the at least two mesh sections of the first bipolar electrode.

In some embodiments, each mesh section of the first bipolar electrode may be characterized by a circular sector shape. The second bipolar electrode may include an annular mesh extending about the at least two mesh sections of the first bipolar electrode. The annular mesh may include a bridge extending through the gap between the at least two mesh sections of the first bipolar electrode. The assemblies may include a first RF power supply or variable capacitor coupled with the first bipolar electrode. The assemblies may include a second RF power supply or variable capacitor coupled with the second bipolar electrode. The assemblies may include a third electrode positioned radially outward from and extending about the first bipolar electrode and the second bipolar electrode. The assemblies may include a third RF power supply or variable capacitor coupled with the third electrode. The assemblies may include a first DC power supply coupled with the first bipolar electrode. The assemblies may include a second DC power supply coupled with the second bipolar electrode.

Some embodiments of the present technology may encompass substrate support assemblies. The assemblies may include an electrostatic chuck body defining a substrate support surface. The assemblies may include a support stem coupled with the electrostatic chuck body. The assemblies may include a first bipolar electrode embedded within the electrostatic chuck body beneath the substrate support surface. The first bipolar electrode may include at least two mesh sections separated by a gap. The assemblies may include a second bipolar electrode embedded within the electrostatic chuck beneath the substrate support surface. The assemblies may include a third electrode positioned radially outward from and extending about the first bipolar electrode and the second bipolar electrode.

Such technology may provide numerous benefits over conventional systems and techniques. For example, embodiments of the present technology may provide substrate supports that may allow radial tuning during plasma processing, and may remain sustainable during high-temperature operations. Additionally, the substrate supports may maintain bipolar chucking while supporting RF modulation. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
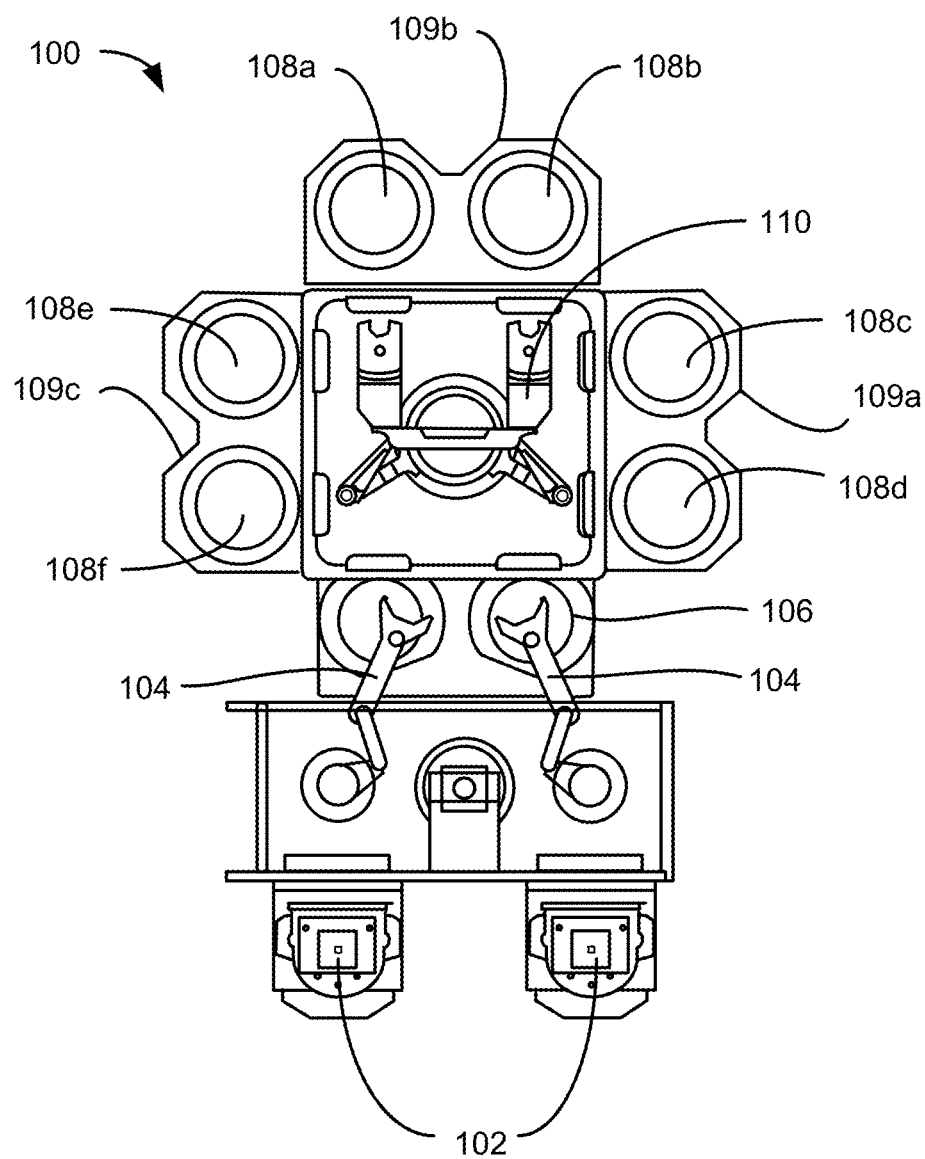
FIG. 1 shows a top plan view of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Plasma enhanced deposition processes may energize one or more constituent precursors to facilitate film formation on a substrate. These formed films may be produced under conditions that cause stresses on the substrate. An electrostatic chuck may be used to produce a clamping action against the substrate to overcome the bowing stress. However, as semiconductor processing continues to increase precision and reduce device sizes, chucking may participate in issues with processing. Additionally, many of these films may be developed at relatively high temperatures that further affect components of the chamber. For example, some deposition activities may occur at temperatures above 500° C. or higher, which may affect the resistivity of chamber components, such as the materials of the electrostatic chuck. As the resistivity of the material reduces, current leakage may increase and lead to electric arcs being produced, which can damage substrates and chamber components.

Many conventional technologies use a monopolar or semicircular electrode bipolar electrostatic chuck, which may lead to many of these processing issues. While the chucks may provide chucking force to stabilize a substrate during processing, the chucks may be otherwise limited, and may contribute to issues with processing. For example, monopolar chucks may cause substrate movement, which can impact process uniformity by shifting a chuck from a central location within the processing chamber. A monopolar chuck utilizes plasma generated during the process to create electrostatic force on the substrate. When a substrate is seated on a support and a monopolar chuck is initially engaged, the wafer may be electrically floating relative to the DC power source of the chucking electrode because the puck body may be insulative. When a plasma is generated, the plasma may ground the substrate, which may effectively complete the circuit and create an electrostatic force between the substrate and chuck body. However, the initial generation may cause movement of the substrate, which may impact uniformity during processing.

Conventional bipolar chucks may include two semicircular electrodes, which may overcome issues with the monopolar chuck by coupling one electrode at positive power and one at negative power. Although the substrate will still be characterized by a net neutral charge, the substrate may be clamped to the substrate support. However, as processing temperatures are raised, leakage through the chuck body may increase, which may increase a likelihood of DC discharge between the two electrodes. An additional issue with both chucks is that they may be limited in additional functionality in terms of plasma tuning.

The present technology overcomes these challenges with substrate support assemblies having bipolar chucking capabilities and additionally providing radial tuning capabilities with the plasma. Radial non-uniformity on a substrate may be caused by a number of issues with flow through the chamber. Although some chamber components may be modified to accommodate certain uniformity issues, once the component is implemented it may be limited to that exact accommodation. By providing radial RF tuning with electrodes in the electrostatic chuck, the present technology may allow center-high and edge-high modulation of processing region plasma development. Additionally, by adjusting the power supplied or drawn by these electrodes, the degree of adjustment can be tuned for any particular process exhibiting non-uniformity.

Although the remaining disclosure will routinely identify specific deposition processes utilizing the disclosed technology, it will be readily understood that the systems and methods are equally applicable to other deposition, etching, and cleaning chambers, as well as processes as may occur in the described chambers. Accordingly, the technology should not be considered to be so limited as for use with these specific deposition processes or chambers alone. The disclosure will discuss one possible system and chamber that may include pedestals according to embodiments of the present technology before additional variations and adjustments to this system according to embodiments of the present technology are described.

FIG. 1 shows a top plan view of one embodiment of a processing system 100 of deposition, etching, baking, and curing chambers according to embodiments. In the figure, a pair of front opening unified pods 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including formation of stacks of semiconductor materials described herein in addition to plasma-enhanced chemical vapor deposition, atomic layer deposition, physical vapor deposition, etch, pre-clean, degas, orientation, and other substrate processes including, annealing, ashing, etc.

The substrate processing chambers 108a-f may include one or more system components for depositing, annealing, curing and/or etching a dielectric or other film on the substrate. In one configuration, two pairs of the processing chambers, e.g., 108c-d and 108e-f, may be used to deposit dielectric material on the substrate, and the third pair of processing chambers, e.g., 108a-b, may be used to etch the deposited dielectric. In another configuration, all three pairs of chambers, e.g., 108a-f, may be configured to deposit stacks of alternating dielectric films on the substrate. Any one or more of the processes described may be carried out in chambers separated from the fabrication system shown in different embodiments. It will be appreciated that additional configurations of deposition, etching, annealing, and curing chambers for dielectric films are contemplated by system 100.

Figure 2:
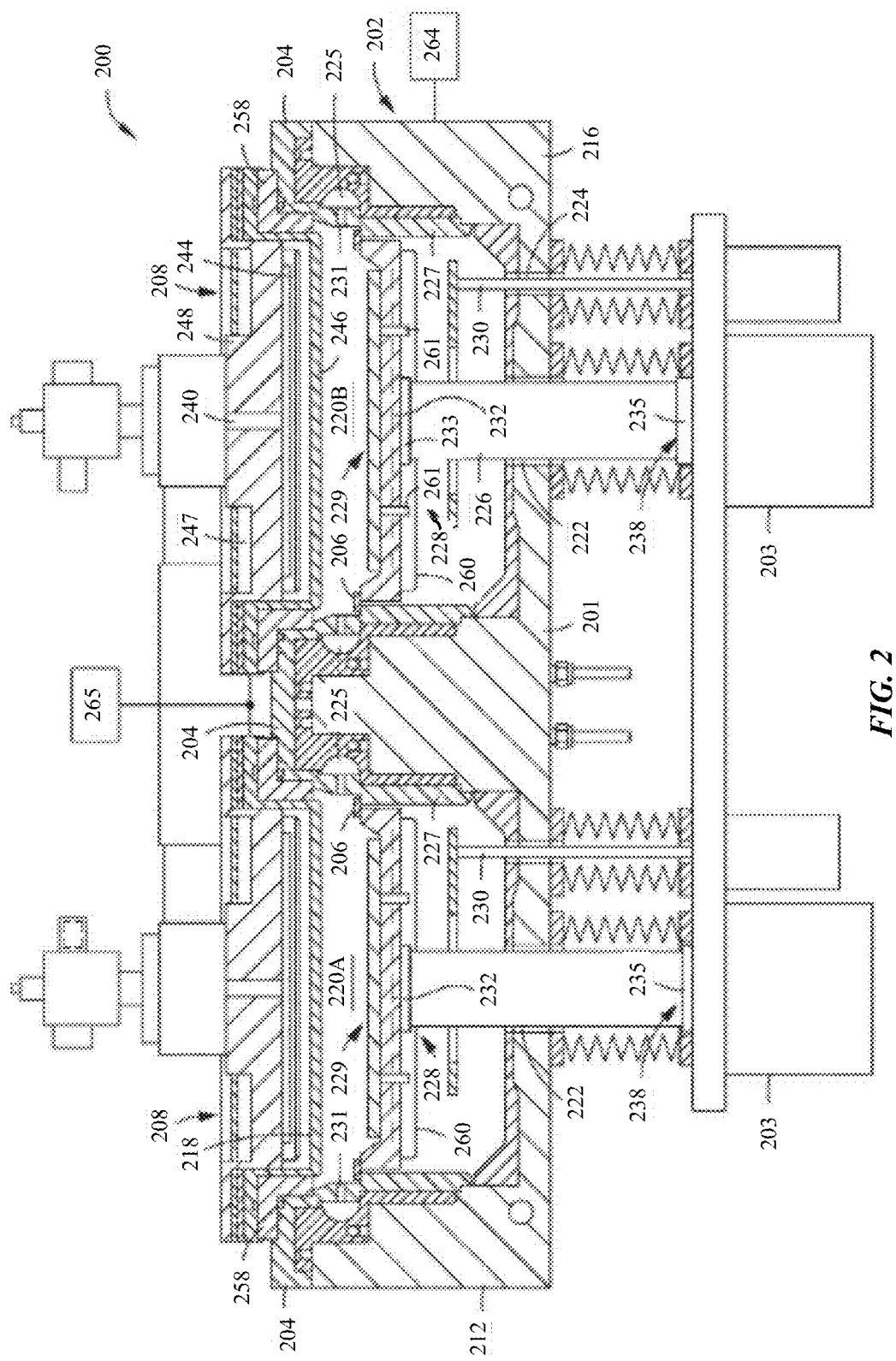
FIG. 2 shows a schematic cross-sectional view of an exemplary plasma system according to some embodiments of the present technology.

FIG. 2 shows a schematic cross-sectional view of an exemplary plasma system 200 according to some embodiments of the present technology. Plasma system 200 may illustrate a pair of processing chambers 108 that may be fitted in one or more of tandem sections 109 described above, and which may include substrate support assemblies according to embodiments of the present technology. The plasma system 200 generally may include a chamber body 202 having sidewalls 212, a bottom wall 216, and an interior sidewall 201 defining a pair of processing regions 220A and 220B. Each of the processing regions 220A-220B may be similarly configured, and may include identical components.

For example, processing region 220B, the components of which may also be included in processing region 220A, may include a pedestal 228 disposed in the processing region through a passage 222 formed in the bottom wall 216 in the plasma system 200. The pedestal 228 may provide a heater adapted to support a substrate 229 on an exposed surface of the pedestal, such as a body portion. The pedestal 228 may include heating elements 232, for example resistive heating elements, which may heat and control the substrate temperature at a desired process temperature. Pedestal 228 may also be heated by a remote heating element, such as a lamp assembly, or any other heating device.

The body of pedestal 228 may be coupled by a flange 233 to a stem 226. The stem 226 may electrically couple the pedestal 228 with a power outlet or power box 203. The power box 203 may include a drive system that controls the elevation and movement of the pedestal 228 within the processing region 220B. The stem 226 may also include electrical power interfaces to provide electrical power to the pedestal 228. The power box 203 may also include interfaces for electrical power and temperature indicators, such as a thermocouple interface. The stem 226 may include a base assembly 238 adapted to detachably couple with the power box 203. A circumferential ring 235 is shown above the power box 203. In some embodiments, the circumferential ring 235 may be a shoulder adapted as a mechanical stop or land configured to provide a mechanical interface between the base assembly 238 and the upper surface of the power box 203.

A rod 230 may be included through a passage 224 formed in the bottom wall 216 of the processing region 220B and may be utilized to position substrate lift pins 261 disposed through the body of pedestal 228. The substrate lift pins 261 may selectively space the substrate 229 from the pedestal to facilitate exchange of the substrate 229 with a robot utilized for transferring the substrate 229 into and out of the processing region 220B through a substrate transfer port 260.

A chamber lid 204 may be coupled with a top portion of the chamber body 202. The lid 204 may accommodate one or more precursor distribution systems 208 coupled thereto. The precursor distribution system 208 may include a precursor inlet passage 240 which may deliver reactant and cleaning precursors through a dual-channel showerhead 218 into the processing region 220B. The dual-channel showerhead 218 may include an annular base plate 248 having a blocker plate 244 disposed intermediate to a faceplate 246. A radio frequency ("RF") source 265 may be coupled with the dual-channel showerhead 218, which may power the dual-channel showerhead 218 to facilitate generating a plasma region between the faceplate 246 of the dual-channel showerhead 218 and the pedestal 228. In some embodiments, the RF source may be coupled with other portions of the chamber body 202, such as the pedestal 228, to facilitate plasma generation. A dielectric isolator 258 may be disposed between the lid 204 and the dual-channel showerhead 218 to prevent conducting RF power to the lid 204. A shadow ring 206 may be disposed on the periphery of the pedestal 228 that engages the pedestal 228.

An optional cooling channel 247 may be formed in the annular base plate 248 of the gas distribution system 208 to cool the annular base plate 248 during operation. A heat transfer fluid, such as water, ethylene glycol, a gas, or the like, may be circulated through the cooling channel 247 such that the base plate 248 may be maintained at a predefined temperature. A liner assembly 227 may be disposed within the processing region 220B in close proximity to the sidewalls 201, 212 of the chamber body 202 to prevent exposure of the sidewalls 201, 212 to the processing environment within the processing region 220B. The liner assembly 227 may include a circumferential pumping cavity 225, which may be coupled to a pumping system 264 configured to exhaust gases and byproducts from the processing region 220B and control the pressure within the processing region 220B. A plurality of exhaust ports 231 may be formed on the liner assembly 227. The exhaust ports 231 may be configured to allow the flow of gases from the processing region 220B to the circumferential pumping cavity 225 in a manner that promotes processing within the system 200.

Figure 3:
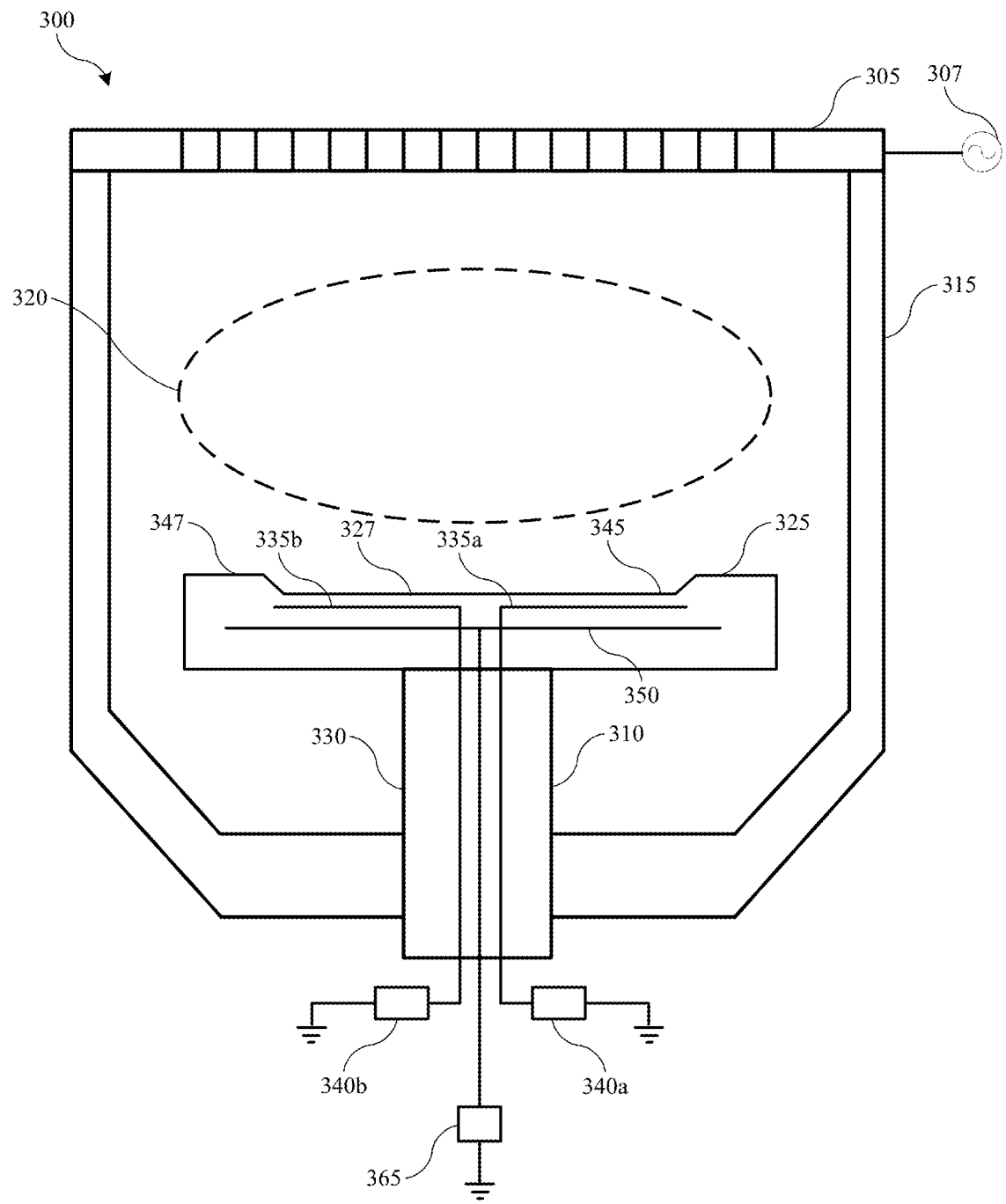
FIG. 3 shows a schematic partial cross-sectional view of an exemplary substrate support assembly according to some embodiments of the present technology.

FIG. 3 shows a schematic partial cross-sectional view of an exemplary semiconductor processing chamber 300 according to some embodiments of the present technology. FIG. 3 may include one or more components discussed above with regard to FIG. 2, and may illustrate further details relating to that chamber. The chamber 300 may be used to perform semiconductor processing operations including deposition of stacks of dielectric materials as previously described. Chamber 300 may show a partial view of a processing region of a semiconductor processing system, and may not include all of the components, such as additional lid stack components previously described, which are understood to be incorporated in some embodiments of chamber 300.

As noted, FIG. 3 may illustrate a portion of a processing chamber 300. The chamber 300 may include a showerhead 305, as well as a substrate support assembly 310. Along with chamber sidewalls 315, the showerhead 305 and the substrate support 310 may define a substrate processing region 320 in which plasma may be generated. The substrate support assembly may include an electrostatic chuck body 325, which may include one or more components embedded or disposed within the body. The components incorporated within the top puck may not be exposed to processing materials in some embodiments, and may be fully retained within the chuck body 325. Electrostatic chuck body 325 may define a substrate support surface 327, and may be characterized by a thickness and length or diameter depending on the specific geometry of the chuck body. In some embodiments the chuck body may be elliptical, and may be characterized by one or more radial dimensions from a central axis through the chuck body. It is to be understood that the top puck may be any geometry, and when radial dimensions are discussed, they may define any length from a central position of the chuck body.

Electrostatic chuck body 325 may be coupled with a stem 330, which may support the chuck body and may include channels for delivering and receiving electrical and/or fluid lines that may couple with internal components of the chuck body 325. Chuck body 325 may include associated channels or components to operate as an electrostatic chuck, although in some embodiments the assembly may operate as or include components for a vacuum chuck, or any other type of chucking system. Stem 330 may be coupled with the chuck body on a second surface of the chuck body opposite the substrate support surface. The electrostatic chuck body 325 may include a first bipolar electrode 335a, which may be embedded within the chuck body proximate the substrate support surface. Electrode 335a may be electrically coupled with a DC power source 340a. Power source 340a may be configured to provide energy or voltage to the electrically conductive chuck electrode 335a. This may be operated to form a plasma of a precursor within the processing region 320 of the semiconductor processing chamber 300, although other plasma operations may similarly be sustained. For example, electrode 335a may also be a chucking mesh that operates as electrical ground for a capacitive plasma system including an RF source 307 electrically coupled with showerhead 305. For example, electrode 335a may operate as a ground path for RF power from the RF source 307, while also operating as an electric bias to the substrate to provide electrostatic clamping of the substrate to the substrate support surface. Power source 340a may include a filter, a power supply, and a number of other electrical components configured to provide a chucking voltage.

The electrostatic chuck body may also include a second bipolar electrode 335b, which may also be embedded within the chuck body proximate the substrate support surface. Electrode 335b may be electrically coupled with a DC power source 340b. Power source 340b may be configured to provide energy or voltage to the electrically conductive chuck electrode 335b. Additionally electrical components and details about bipolar chucks according to some embodiments will be described further below, and any of the designs may be implemented with processing chamber 300. For example, additional plasma related power supplies or components may be incorporated as will be explained further below.

In operation, a substrate may be in at least partial contact with the substrate support surface of the electrostatic chuck body, which may produce a contact gap, and which may essentially produce a capacitive effect between a surface of the pedestal and the substrate. Voltage may be applied to the contact gap, which may generate an electrostatic force for chucking. The power supplies 340a and 340b may provide electric charge that migrates from the electrode to the substrate support surface where it may accumulate, and which may produce a charge layer having Coulomb attraction with opposite charges at the substrate, and which may electrostatically hold the substrate against the substrate support surface of the chuck body. This charge migration may occur by current flowing through a dielectric material of the chuck body based on a finite resistance within the dielectric for Johnsen-Rahbek type chucking, which may be used in some embodiments of the present technology.

Chuck body 325 may also define a recessed region 345 within the substrate support surface, which may provide a recessed pocket in which a substrate may be disposed. Recessed region 345 may be formed at an interior region of the top puck and may be configured to receive a substrate for processing. Recessed region 345 may encompass a central region of the electrostatic chuck body as illustrated, and may be sized to accommodate any variety of substrate sizes. A substrate may be seated within the recessed region, and contained by an exterior region 347, which may encompass the substrate. In some embodiments the height of exterior region 347 may be such that a substrate is level with or recessed below a surface height of the substrate support surface at exterior region 347. A recessed surface may control edge effects during processing, which may improve uniformity of deposition across the substrate in some embodiments. In some embodiments, an edge ring may be disposed about a periphery of the top puck, and may at least partially define the recess within which a substrate may be seated. In some embodiments, the surface of the chuck body may be substantially planar, and the edge ring may fully define the recess within which the substrate may be seated.

In some embodiments the electrostatic chuck body 325 and/or the stem 330 may be insulative or dielectric materials. For example, oxides, nitrides, carbides, and other materials may be used to form the components. Exemplary materials may include ceramics, including aluminum oxide, aluminum nitride, silicon carbide, tungsten carbide, and any other metal or transition metal oxide, nitride, carbide, boride, or titanate, as well as combinations of these materials and other insulative or dielectric materials. Different grades of ceramic materials may be used to provide composites configured to operate at particular temperature ranges, and thus different ceramic grades of similar materials may be used for the top puck and stem in some embodiments. Dopants may be incorporated in some embodiments to adjust electrical properties as well. Exemplary dopant materials may include yttrium, magnesium, silicon, iron, calcium, chromium, sodium, nickel, copper, zinc, or any number of other elements known to be incorporated within a ceramic or dielectric material.

Electrostatic chuck body 325 may also include an embedded heater 350 contained within the chuck body. Heater 350 may include a resistive heater or a fluid heater in embodiments. In some embodiments the electrode 335 may be operated as the heater, but by decoupling these operations, more individual control may be afforded, and extended heater coverage may be provided while limiting the region for plasma formation. Heater 350 may include a polymer heater bonded or coupled with the chuck body material, although a conductive element may be embedded within the electrostatic chuck body and configured to receive current, such as AC current, to heat the top puck. The current may be delivered through the stem 330 through a similar channel as the DC power discussed above. Heater 350 may be coupled with a power supply 365, which may provide current to a resistive heating element to facilitate heating of the associated chuck body and/or substrate. Heater 350 may include multiple heaters in embodiments, and each heater may be associated with a zone of the chuck body, and thus exemplary chuck bodies may include a similar number or greater number of zones than heaters. The chucking mesh electrodes 335 may be positioned between the heater 350 and the substrate support surface 327 in some embodiments, and a distance may be maintained between the electrode within the chuck body and the substrate support surface in some embodiments as will be described further below.

The heater 350 may be capable of adjusting temperatures across the electrostatic chuck body 325, as well as a substrate residing on the substrate support surface 327. The heater may have a range of operating temperatures to heat the chuck body and/or a substrate above or about 100° C., and the heater may be configured to heat above or about 125° C., above or about 150° C., above or about 175° C., above or about 200° C., above or about 250° C., above or about 300° C., above or about 350° C., above or about 400° C., above or about 450° C., above or about 500° C., above or about 550° C., above or about 600° C., above or about 650° C., above or about 700° C., above or about 750° C., above or about 800° C., above or about 850° C., above or about 900° C., above or about 950° C., above or about 1000° C., or higher. The heater may also be configured to operate in any range encompassed between any two of these stated numbers, or smaller ranges encompassed within any of these ranges. In some embodiments, the chuck heater may be operated to maintain a substrate temperature above at least 500° C. during deposition operations.

Figure 4A:
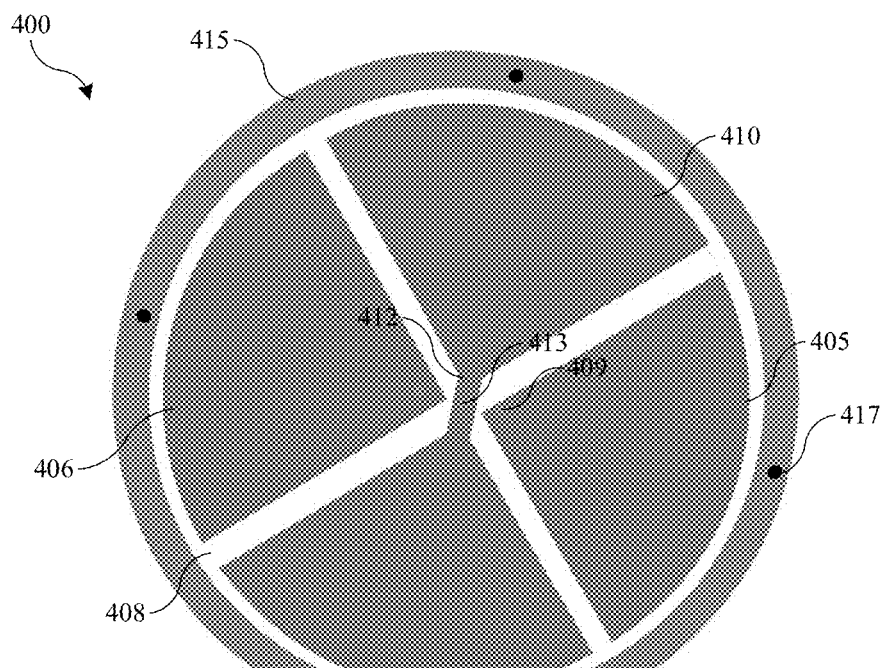
FIG. 4A shows a schematic top view of an electrode arrangement for an exemplary substrate support assembly according to some embodiments of the present technology.

FIG. 4A shows a schematic top view of an electrode arrangement 400 for an exemplary substrate support assembly according to some embodiments of the present technology. Electrodes in arrangement 400 may be any of the electrodes previously described, such as may be included in substrate support assembly 310, or any other number of pedestals or chucks. The electrodes may be operable as an electrostatic chuck as discussed above, and as will be further described below. As illustrated, electrode arrangement 400 may include a first bipolar electrode 405, and a second bipolar electrode 410. The electrodes may be embedded in a puck or chuck body as described above, such as a ceramic including aluminum nitride, and may be characterized by any of the features, configurations, or characteristics as discussed above for any substrate support.

First bipolar electrode 405 and second bipolar electrode 410 may each include a mesh material that may be substantially coplanar across both electrodes within the electrostatic chuck. As illustrated, the mesh materials may be separated into sections. For example, first bipolar electrode 405 may include at least two separated mesh sections 406. Each mesh section may be characterized by any number of shapes or geometries, such as circular sectors as illustrated, as well as rectangles, or any other shape, which may be at least in part determined from substrate geometries, for example. Although the sector shapes are substantially quadrant shaped, it is to be understood that any minor sector or major sector shape may be utilized in embodiments of the present technology. The mesh sections 406 may be discontinuous, and in some embodiments may not contact one another along the plane of the mesh materials. As shown, one or more gaps 408 may be formed about each mesh section 406 of the first bipolar electrode 405, and each mesh section may be isolated within the chuck body from any other mesh section of either the first bipolar electrode or the second bipolar electrode. Although two such mesh sections are illustrated, in some embodiments first bipolar electrode 405 may include greater than or about 2 sections, greater than or about 3 sections, greater than or about 4 sections, greater than or about 5 sections, greater than or about 6 sections, greater than or about 7 sections, greater than or about 8 sections, or more. However, as the number of mesh sections increases, the amount of gap area may similarly increase, which may reduce chucking in the regions where no mesh extends. Thus, in some embodiments the mesh may include less than or about 8 sections, less than or about 6 sections, or less. Electrode leads may couple with the first bipolar electrode at each mesh section, such as at positions 409, which may be anywhere along the mesh in some embodiments.

Second bipolar electrode 410 may be or include a continuous mesh section as illustrated, which may extend through the at least two separated mesh sections of the first bipolar electrode 405. For example, as illustrated, second bipolar electrode 410 may extend through a gap 408 between sections of the first bipolar electrode as shown. At least one electrode lead may couple with the second bipolar electrode at a position 413 along the electrode. Second bipolar electrode 410 may be characterized by any shape or geometry as noted above, and may be characterized by a shape that corresponds or accommodates the shape of first bipolar electrode 405. For example, where the first bipolar electrode sections are circular sector shapes as illustrated, second bipolar electrode 410 may also be characterized by at least two mesh sections that may also be circle sector shaped. The sections of second bipolar electrode 410 may be coupled with a bridge 412 portion that extends through the gap between the first bipolar electrode sections as illustrated.

Figure 4B:
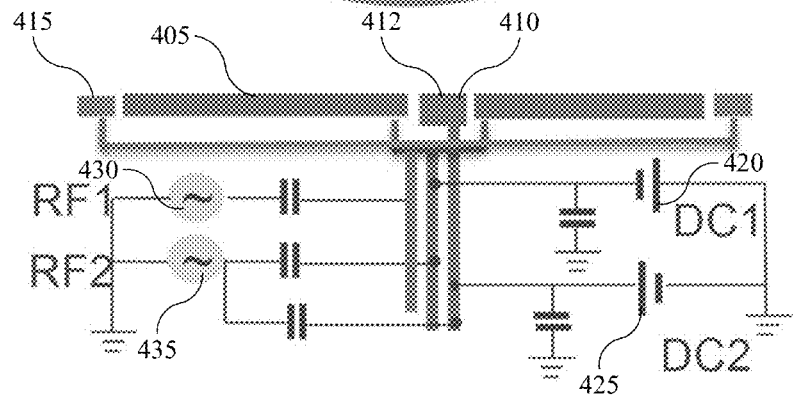
FIG. 4B shows a schematic partial cross-sectional view of an electrode arrangement for an exemplary substrate support assembly according to some embodiments of the present technology.

As illustrated, in some embodiments the arrangement 400 may include a third electrode 415, which may be located or positioned radially outward from the first bipolar electrode and the second bipolar electrode, and may extend about the bipolar electrodes as illustrated. In some embodiments the third electrode may be included beneath the exterior region 347, for example, or may otherwise be about an edge region of the substrate support. Electrode leads may couple with the third electrode at one or more positions 417 as illustrated. Although four such lead positions are illustrated, any number of leads may be provided in embodiments to ensure uniform delivery to the electrode. Each of the electrodes may be coupled with one or more power supplies as can be seen in FIG. 4B. FIG. 4B shows a schematic partial cross-sectional view of electrode arrangement 400 for an exemplary substrate support assembly according to some embodiments of the present technology. As shown, the arrangement 400 may include a first bipolar electrode 405 and a second bipolar electrode 410, where the cross-section may illustrate the second bipolar electrode 410 through the bridge 412 portion of the mesh. In some embodiments the arrangement may also include a third electrode 415.

Each electrode may be coupled with one or more power supplies as previously described, and FIG. 4B illustrates an exemplary coupling arrangement, although it is to be understood that any number of electrode coupling configurations may be used. For example, the first bipolar electrode sections may be coupled with a first DC power supply 420, and the second bipolar electrode may be coupled with a second DC power supply 425. Either power supply may be operated in a positive or negative voltage arrangement, which may be switched during processing, for example, as well as increased or decreased in either direction to provide electrostatic chucking. One or more RF power supplies may also be incorporated in some embodiments. For example, a first RF power supply 430 may be coupled with the third electrode 415, and a second RF power supply 430 may be coupled with the first bipolar electrode and the second bipolar electrode. Although a separate RF power supply may be coupled with each of the bipolar electrodes, as will be described below, in some embodiments a single power supply may be used based on the configuration of the electrodes.

In operation, by including a separate RF power supply coupled with the third electrode, process plasma may be tuned to affect a process being performed. For example, in the bottom up RF power feed configuration illustrated, by increasing RF power to the edge of the chuck, increased current may be delivered to the plasma at the edge, which may increase plasma characteristics. During a deposition operation, for example, this may increase edge deposition, which may compensate for a center-high deposition process to increase radial uniformity of the process. Depending on the extent of the non-uniformity, the power delivered may be increased or decreased to produce a more uniform process. In this way, while producing a bipolar configuration that may ensure sufficient chucking, the substrate support may also be used to provide additional process tuning with RF control at multiple regions. Additionally, as illustrated, the electrode leads may extend laterally through the chuck body at different vertical planes, which may limit leakage and interference.

Figure 4C:
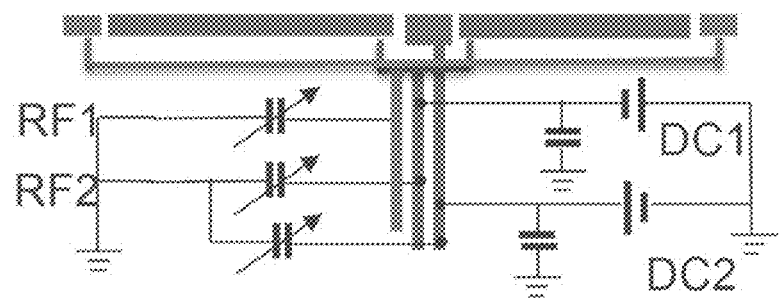
FIG. 4C shows a schematic partial cross-sectional view of an electrode arrangement for an exemplary substrate support assembly according to some embodiments of the present technology.

While the figure illustrates a bottom RF power feed configuration, it is to be understood that any of the configurations illustrated throughout the present disclosure may similarly be produced with a top RF power feed in embodiments, such as based on RF source 307. For example, FIG. 4C shows a schematic partial cross-sectional view of electrode arrangement 400 for an exemplary substrate support assembly according to some embodiments of the present technology, and may illustrate the same configuration for the electrodes, but utilizing a top RF power feed control. For example, instead of utilizing RF power supplies as shown in FIG. 4B, in some embodiments a variable capacitor may be used to control current splitting through the various electrode sections. For example, instead of increasing power from a power supply to add power to the plasma, in some embodiments the control scheme may utilize a variable capacitor and may increase the capacitance, which may increase current flow through the plasma to the associated electrode in that region. This may similarly increase plasma density in the associated region and increase deposition or etching in the region.

Figure 5A:
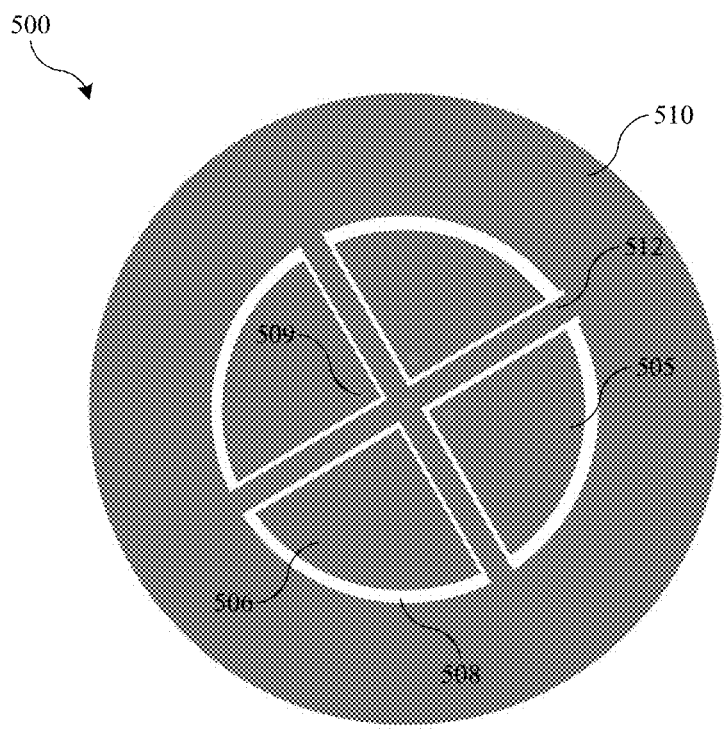
FIG. 5A shows a schematic top view of an electrode arrangement for an exemplary substrate support assembly according to some embodiments of the present technology.

The present technology may similarly encompass other bipolar chuck configurations that can be incorporated within any of the substrate supports as previously described. FIG. 5A shows a schematic top view of an electrode arrangement 500 for an exemplary substrate support assembly according to some embodiments of the present technology. Arrangement 500 may include any of the features or characteristics of arrangement 400, and may be incorporated in any substrate support in which bipolar chucking may be used, including any substrate support previously described. For example, arrangement 500 may include a first bipolar electrode 505 and a second bipolar electrode 510. First bipolar electrode 505 may include at least two separated mesh sections 506, and in the exemplary embodiment illustrated may include four mesh sections 506, although it is to be understood that any number of mesh sections may be included as previously discussed. Each mesh section 506 of the first bipolar electrode 505 may be separated from one another by a gap 508. Each of the mesh sections 506 may be electrically coupled with a single power supply as will be discussed below, and any number of electrode leads may be used to couple the individual sections at positions 509, which may be anywhere along the mesh.

Second bipolar electrode 510 may include an annular mesh extending about the mesh sections of the first bipolar electrode. Additionally, second bipolar electrode 510 may include bridges 512 extending through the gaps between the separated mesh sections of the first bipolar electrode. Such a configuration may provide both a capability for RF tuning as described above, as well as electrostatic chucking from the two bipolar electrodes. This may improve edge region chucking in some embodiments. For example, some semiconductor processing may include processing incoming wafers characterized by an increased wafer bow at an edge region of the substrate. Ensuring complete clamping at an exterior edge may ensure the substrate remains substantially flat during processing, which otherwise may increase processing non-uniformity or damage to the substrate. Because second bipolar electrode 510 may extend to or past an edge of a semiconductor substrate being processed, sufficient clamping may be afforded with such a design including a second bipolar electrode extending about the first bipolar electrode.

Figure 5B:
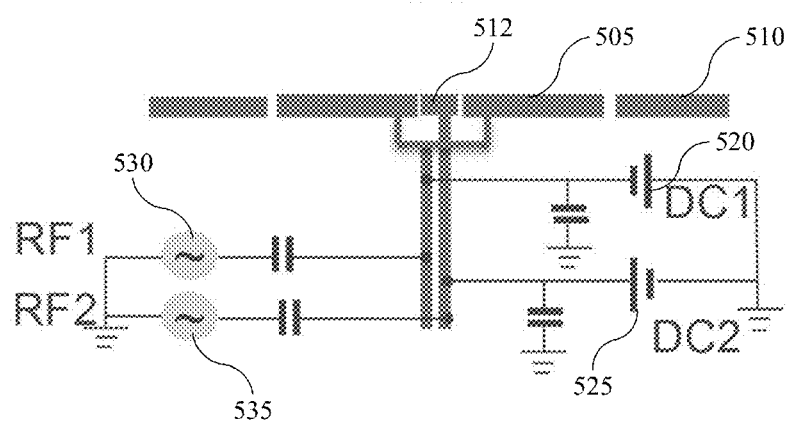
FIG. 5B shows a schematic partial cross-sectional view of an electrode arrangement for an exemplary substrate support assembly according to some embodiments of the present technology.

Additionally, the configuration of having the annular bipolar electrode extending about the first bipolar electrode may facilitate radial tuning of RF as well. FIG. 5B shows a schematic partial cross-sectional view of electrode arrangement 500 for an exemplary substrate support assembly according to some embodiments of the present technology, and may include any feature, characteristic, or component as described above, and may be included in any substrate support described elsewhere. As shown in the cross section, second bipolar electrode 510 may extend about first bipolar electrode 505, and include bridges 512 extending between the mesh sections of first bipolar electrode 505. Similar to as described above, a first DC power supply 520 may be coupled with the first bipolar electrode 505, and a second DC power supply 525 may be coupled with the second bipolar electrode. Additionally, a first RF power supply 530 may be coupled with the first bipolar electrode 505 and a second RF power supply 535 may be coupled with the second bipolar electrode 510. Because the second bipolar electrode may extend about the first bipolar electrode 505, by operating the individual RF power supplies as discussed above, radial tuning of the plasma may be performed in the inner and outer zone, and the tuning may be performed prior to processing operations, or in situ during any process. As noted above, the configuration of FIG. 5B may also be produced with variable capacitors for a top RF power feed as discussed previously, and as would be readily appreciated by the skilled artisan.

Figure 6A:
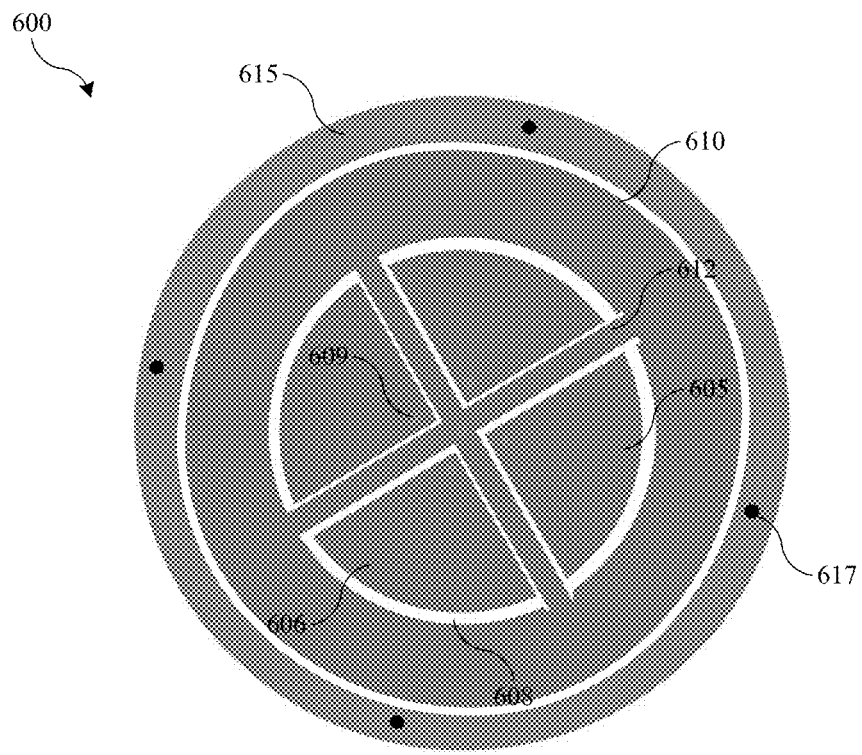
FIG. 6A shows a schematic top view of an electrode arrangement for an exemplary substrate support assembly according to some embodiments of the present technology.

FIG. 6A shows a schematic top view of an electrode arrangement 600 for an exemplary substrate support assembly according to some embodiments of the present technology. Arrangement 600 may include any of the features or characteristics of arrangement 400 or arrangement 500, and may be incorporated in any substrate support in which bipolar chucking may be used, including any substrate support previously described. For example, arrangement 600 may include a first bipolar electrode 605 and a second bipolar electrode 610. First bipolar electrode 605 may include at least two separated mesh sections 606, and in the exemplary embodiment illustrated may include four mesh sections 606, although it is to be understood that any number of mesh sections may be included as previously discussed. Each mesh section 606 of the first bipolar electrode 605 may be separated from one another by a gap 608. Each of the mesh sections 606 may be electrically coupled with a single power supply as will be discussed below, and any number of electrode leads may be used to couple the individual sections at positions 609, which may be anywhere along the mesh.

Second bipolar electrode 610 may include an annular mesh extending about the mesh sections of the first bipolar electrode. Additionally, second bipolar electrode 610 may include bridges 612 extending through the gaps between the separated mesh sections of the first bipolar electrode. A third electrode 615 may also be included in some embodiments, and which may be located or positioned radially outward from the first bipolar electrode and the second bipolar electrode, and may extend about the bipolar electrodes as illustrated. In some embodiments the third electrode may be included beneath the exterior region 347, as described above, or may otherwise be about an edge region of the substrate support. Electrode leads may couple with the third electrode at one or more positions 617 as illustrated. Although four such lead positions are illustrated, any number of leads may be provided in embodiments as previously described.

Such a configuration may provide both a greater capability for RF tuning as described above, as well as electrostatic chucking from the two bipolar electrodes. This may improve edge region chucking in some embodiments by providing three radial, concentric zones that may be individually controlled. This configuration may provide both improved chucking as well as improved radial RF tuning compared to conventional technologies.

Figure 6B:
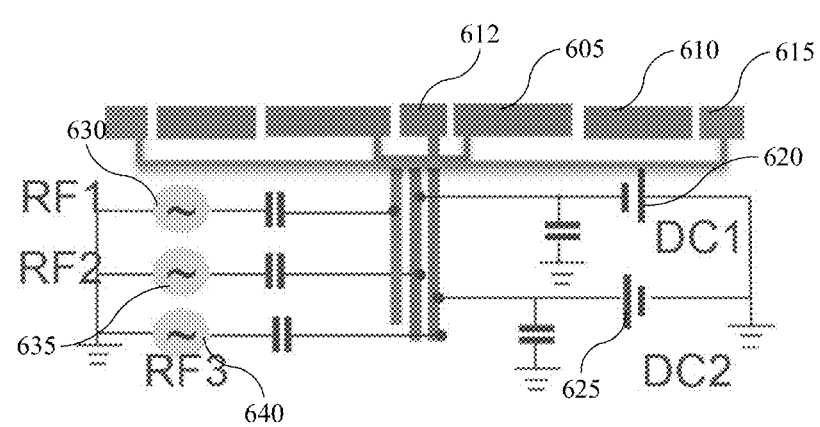
FIG. 6B shows a schematic partial cross-sectional view of an electrode arrangement for an exemplary substrate support assembly according to some embodiments of the present technology.

As noted above, an additional amount of radial tuning may be provided by the configuration by utilizing three separate radial zones based on the electrode locations. FIG. 6B shows a schematic partial cross-sectional view of electrode arrangement 600 for an exemplary substrate support assembly according to some embodiments of the present technology, and may include any feature, characteristic, or component as described above, and may be included in any substrate support described elsewhere. As shown in the cross section, second bipolar electrode 610 may extend about first bipolar electrode 605, and include bridges 612 extending between the mesh sections of first bipolar electrode 605. Third electrode 615 may be located radially outward from the second bipolar electrode 610. Similar to as described above, a first DC power supply 620 may be coupled with the first bipolar electrode 605, and a second DC power supply 625 may be coupled with the second bipolar electrode. Additionally, a first RF power supply 630 may be coupled with the third electrode 615, a second RF power supply 635 may be coupled with the first bipolar electrode 605, and a third RF power supply 640 may be coupled with the second bipolar electrode 610.

Because the second bipolar electrode may extend about the first bipolar electrode 605, and the third electrode may extend about the second bipolar electrode 615, by operating the individual RF power supplies as discussed above, radial tuning of the plasma may be performed in the inner zone, a middle zone, and an outer zone, and the tuning may be performed prior to processing operations, or in situ during any process. Again as noted above, the configuration may utilize either a bottom RF power feed or a top RF power feed utilizing variable capacitors as previously described in FIG. 4C. By utilizing bipolar configurations according to embodiments of the present technology, consistent substrate placement may be assured, while additionally providing process control affording radial tuning of plasma being generated.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a heater" includes a plurality of such heaters, and reference to "the protrusion" includes reference to one or more protrusions and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A substrate support assembly comprising:
an electrostatic chuck body defining a substrate support surface;
a first bipolar electrode embedded within the electrostatic chuck body beneath the substrate support surface;
a second bipolar electrode embedded within the electrostatic chuck beneath the substrate support surface, wherein the first bipolar electrode and the second bipolar electrode are separated by a gap;
a third electrode positioned radially outward from and extending about the first bipolar electrode and the second bipolar electrode
a connection for a first radio frequency (RF) power supply or variable capacitor coupled with the first bipolar electrode and/or the second bipolar electrode; and
a connection for a second RF power supply or variable capacitor coupled with the third bipolar electrode.

2. The substrate support assembly of claim 1, wherein the third electrode is ring-shaped.

3. The substrate support assembly of claim 1, wherein the first bipolar electrode occupies about half of an area inside the third electrode.

4. The substrate support assembly of claim 3, wherein the second bipolar electrode occupies about a remaining half of the area inside the third electrode.

5. The substrate support assembly of claim 1, wherein the connection for the first RF power supply or variable capacitor is also configured to receive positive and negative DC chucking voltages.

6. The substrate support assembly of claim 1, wherein the third electrode comprises an annular mesh extending about the at least two mesh sections of the first bipolar electrode and the second bipolar electrode.

7. The substrate support assembly of claim 1, wherein a plurality of lead lines extending within the electrostatic chuck body couple the third electrode to the connection for the second RF power supply or variable capacitor.

8. The substrate support assembly of claim 1, wherein the electrostatic chuck body comprises a ceramic material.

9. The substrate support assembly of claim 1, wherein the ceramic material comprises aluminum nitride.

10. The substrate support assembly of claim 1, wherein at least a portion of the first bipolar electrode is characterized by a circular sector shape.

11. The substrate support assembly of claim 1, wherein at least a portion of the second bipolar electrode is characterized by a circular sector shape.

12. The substrate support assembly of claim 1, further comprising a support stem coupled with the electrostatic chuck body.

* * * * *